(12) United States Patent
Koshimizu et al.

(10) Patent No.: US 12,015,053 B2
(45) Date of Patent: Jun. 18, 2024

(54) SEMICONDUCTOR DEVICE

(71) Applicant: RENESAS ELECTRONICS CORPORATION, Tokyo (JP)

(72) Inventors: Makoto Koshimizu, Tokyo (JP); Yasutaka Nakashiba, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/717,724

(22) Filed: Apr. 11, 2022

(65) Prior Publication Data
US 2022/0376040 A1    Nov. 24, 2022

(30) Foreign Application Priority Data

May 21, 2021 (JP) ................................ 2021-085964

(51) Int. Cl.
*H01L 29/06* (2006.01)
*H01L 29/78* (2006.01)
*H01L 29/66* (2006.01)

(52) U.S. Cl.
CPC ...... *H01L 29/0607* (2013.01); *H01L 29/7823* (2013.01); *H01L 29/66681* (2013.01)

(58) Field of Classification Search
CPC ............. H01L 29/0607; H01L 29/7823; H01L 29/518; H01L 29/513; H01L 29/517; H01L 29/42368; H01L 29/7835; H01L 29/42364; H01L 29/66681–66704; H01L 29/7816–7826; H01L 29/402–407; H01L 29/66568–66659
See application file for complete search history.

(56) References Cited

U.S. PATENT DOCUMENTS

| 2009/0140343 | A1* | 6/2009 | Feilchenfeld ..... H01L 29/66689 |
| | | | 257/E29.256 |
| 2014/0264588 | A1 | 9/2014 | Chen et al. |
| 2021/0257248 | A1* | 8/2021 | Chang ............... H01L 21/76814 |
| 2022/0199827 | A1* | 6/2022 | Weis ..................... H01L 29/404 |

FOREIGN PATENT DOCUMENTS

| CN | 102790090 A | 11/2012 |
| CN | 112397591 A * | 2/2021 ......... H01L 29/0649 |

OTHER PUBLICATIONS

K. Takahashi et al., "Hot-carrier Induced Off-state Leakage Current Increase of LDMOS and Approach to Overcome the Phenomenon", Proceedings of the 30th International Symposium on Power Semiconductor Devices & ICs, May 13-17, 2018, Chicago, pp. 303-306.
Extended European Search Report issued in corresponding European Patent Application No. 22172089.9-1212, dated Oct. 18, 2022.

* cited by examiner

*Primary Examiner* — Shahed Ahmed
(74) *Attorney, Agent, or Firm* — Rimon P.C.

(57) ABSTRACT

A semiconductor device includes a semiconductor substrate, a gate dielectric film formed on the semiconductor substrate, a gate electrode formed on the gate dielectric film, a field plate portion which is integrally formed with the gate electrode, a step insulating film in contact with the field plate portion, a high dielectric constant film in contact with the step insulating film and having a higher dielectric constant than silicon.

10 Claims, 26 Drawing Sheets

SEMICONDUCTOR DEVICE

CROSS-REFERENCE TO RELATED APPLICATIONS

The disclosure of Japanese Patent Application No. 2021-085964 filed on May 21, 2021, including the specification, drawings and abstract is incorporated herein by reference in its entirety.

BACKGROUND

The present invention relates to a semiconductor device and, for example, to techniques valid for application to semiconductor device including laterally diffused MOSFET (LDMOSFET: Laterally Diffused Metal Oxide Semiconductor Field Effect Transistor).

There are disclosed techniques listed below.

[Non-Patent Document 1] Keita Takahashi, Kanako Komatsu, Toshihiro Sakamoto, Koji Kimura and Fumitomo Matsuoka "Hot carrier Induced Off-state Leakage Current Increase of LDMOS and Approach to Overcome the Phenomenon", Proceedings of the 30th International Symposium on Power Semiconductor Devices & ICs May 13-17, 2018, Chicago, USA Non-Patent Document 1 discloses, according to LDMOSFET of employing a step insulating film (Step-OX), that an increase of off-leakage current due to hot carrier injection causing an increase of power consumption and failure of the circuit operation can be suppressed.

SUMMARY

As described in the above-described Non-Patent Document 1, LDMOSFET employing a step insulating film can suppress an increase of off-leakage current as compared with LDMOSFET employing an STI structure, by replacing the STI structure with a step insulating film.

However, even in LDMOSFET of employing a step insulating film, since it cannot be sufficiently suppressed hot carrier injection into the step insulating film, there is room for improvement from the viewpoint of improving the performance of semiconductor device including LDMOSFET.

A semiconductor device according to one embodiment includes a semiconductor substrate, a gate dielectric film formed on the semiconductor substrate, a gate electrode formed on the gate dielectric film, a field plate portion integrally formed with the gate electrode, a step insulating film in contact with the field plate portion, and a high dielectric constant film having a higher dielectric constant than silicon and in contact with the step insulating film.

According to one embodiment, the performance of semiconductor device including LDMOSFET can be improved.

DETAILED DESCRIPTION

Figure 1:
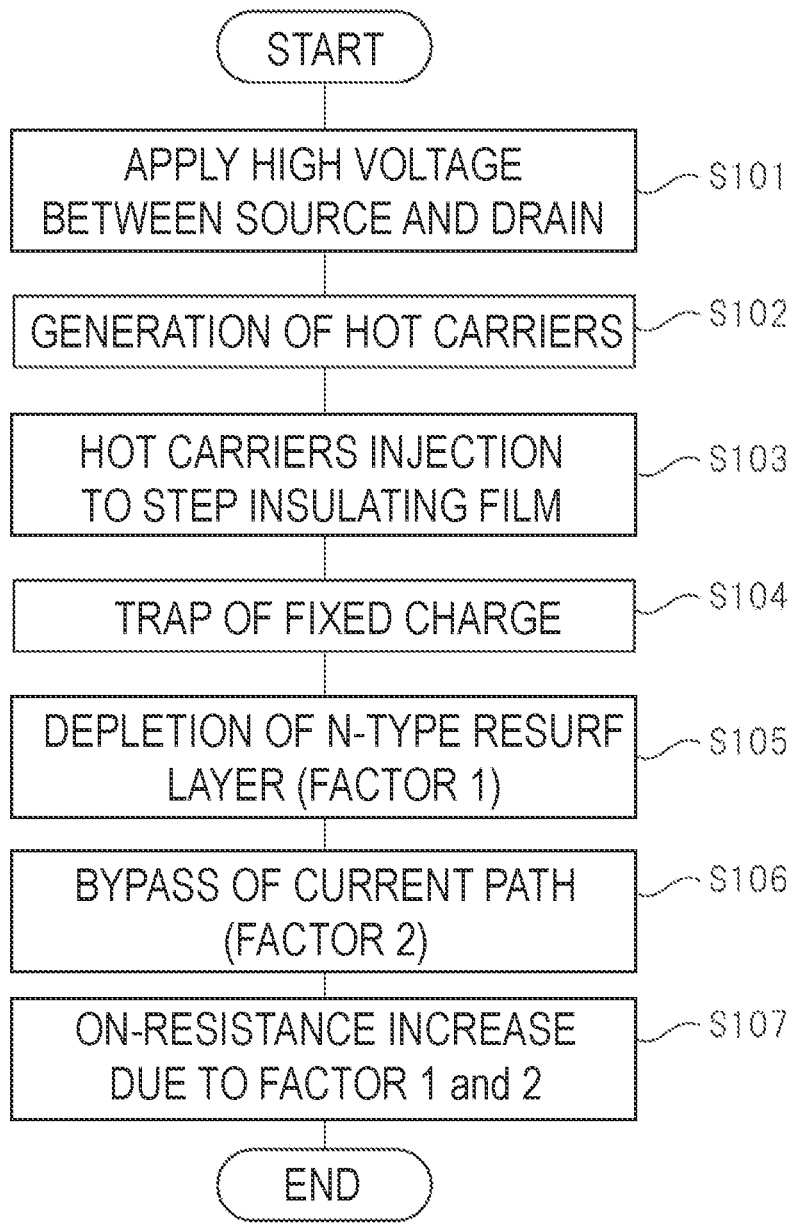
FIG. 1 is a flowchart for explaining the mechanism of increase of the on-resistance of LDMOSFET when hot carriers are injected into the step insulating film.

In all the drawings for explaining the embodiments, the same members are denoted by the same reference numerals in principle, and repetitive descriptions thereof are omitted. Note that even plan view may be hatched for the sake of clarity.

Study of Improvement

The present inventors have found a new room for improvement regarding the on-resistance is increased by hot carriers are injected into the step insulating film in LDMOSFET employing the step insulating film. Therefore, the mechanism that the on-resistance of LDMOSFET is increased when hot carriers are injected into the step insulating film, will be described.

FIG. 1 is a flowchart for explaining the mechanism of increase of the on-resistance of LDMOSFET when hot carriers are injected into the step insulating film.

In FIG. 1, first, LDMOSFET turns on by applying a gate voltage above the threshold voltage to the gate electrode in a state that a high voltage applied between the source and drain of LDMOSFET (S101). This causes electrons to flow from the source through the channel to the drain. At this time, hot carriers are generated as a result of electrons accelerated by the high voltage applied between the source and drain (S102). In particular, since the corner portion vicinity of the step insulating film is a high electric field, the hot carriers generated by accelerating with the high electric field overcomes the potential barrier by the step insulating film and the hot carriers are injected into the step insulating film (S103). Thus, a fixed charge (negative charge) is trapped in the step insulating film (S104). Consequently, since the step insulating film is charged negatively (minus), depletion phenomena occurs on the surface of the n-type resurf layer in contact with the step insulating film (S105). Then, since this depletion region functions as an insulating region, electrons flowing from the source through the channel to the drain will be bypassed so as to avoid the depletion region formed on the surface of the re-type resurf layer (S106).

As described above, the on-resistance of LDMOSFET is increased by the "factor 1" of depletion of the n-type resurf layer caused by hot carriers are injected into the step insulating film, and by the "factor 2" that the distance becomes longer because the path through which electrons flow is alternate path (S107). By such a mechanism, in LDMOSFET of employing a step insulating film, by hot carriers are injected into the step insulating film, it becomes apparent room for improvement that the on-resistance is increased.

Therefore, in the present embodiment, it is devised for room for improvement regarding the increase of on-resistance that exists in above described. LDMOSFET employing the step insulating film. Hereinafter, the technical idea in the present embodiment to which the devise is applied will be described.

Basic Concept of Present Embodiment

The basic concept of the present embodiment is that a potential control film is provided in LDMOSFET to form a potential barrier for electrons on the surface of the semiconductor substrate located under the step insulating film. This allows the electron-flowing current path to be shifted from "the surface of the semiconductor substrate" to "the inner part of the semiconductor substrate (inside the bulk)" by the potential barrier formed on the surface of the semiconductor substrate located under the step insulating film. That is, because the potential barrier moves electrons away from the surface of the semiconductor substrate, the current path through which the electrons flow shifts from "the surface of the semiconductor substrate" to "the inner part of the semiconductor substrate (inside the bulk)". This means that the current path through which the electrons flow moves away from the interface between the step insulating film and the semiconductor substrate, thereby suppressing the injection of hot carriers into the step insulating film. Consequently, according to the basic concept, it is possible to suppress the increase of the on-resistance of LDMOSFET caused by the injection of hot carriers into the step insulating film.

Hereinafter, the present embodiment will be described in detail with reference to the drawings.

Figure 2:
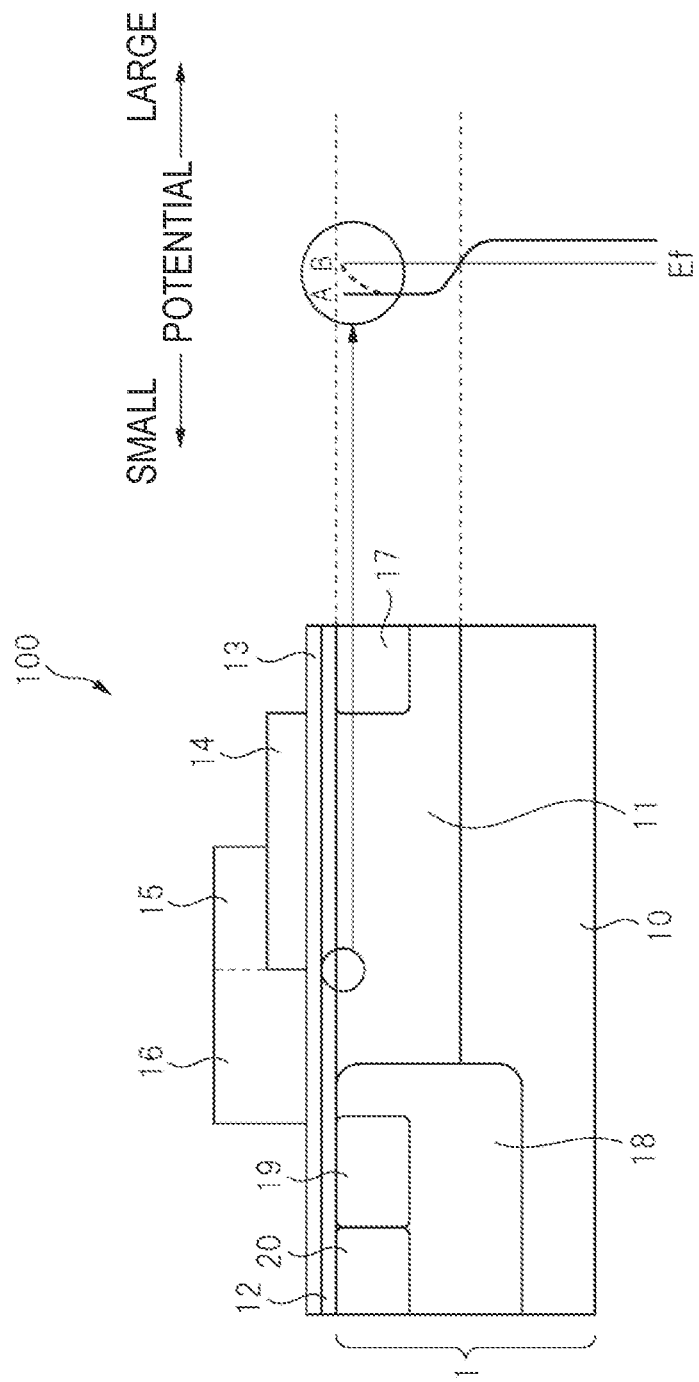
FIG. 2 is a diagram explaining the basic concept in the present embodiment.

FIG. 2 is a diagram for explaining the basic concept in the present embodiment. In FIG. 2, LDMOSEFT 100 has a semiconductor substrate 1. In the semiconductor substrate 1, a p-type resurf layer 10 and an n-type resurf layer 11 which formed on the p-type resurf layer 10 are formed. The n-type resurf layer 11 is also referred to as an n-type drift layer. A gate dielectric film 12 is formed on the semiconductor substrate 1, and a potential control film 13 is formed on the gate dielectric film 12. The potential control film 13 is in contact with the step insulating film 14, and a field plate portion 15 in contact with the step insulating film 14 and a gate electrode 16 in contact with the potential control film 13 are integrally formed. In addition, a drain region 17 formed of an n-type semiconductor region is formed in the n-type resurf layer 11 so as to be aligned with the step insulating film 14. Furthermore, a p-type body region 18 is formed in the semiconductor substrate 1, and a source region formed of an n-type semiconductor region and a body contact region 20 formed of a p-type semiconductor region are formed so as to be included in the p-type body region 18.

The basic concept in the present embodiment is to form a potential barrier for electrons on the surface of the semiconductor substrate 1 located under the step insulating film 14 by the potential control film 13 provided in LDMOSFET 100 configured as described above. Specifically, as shown in the right part of FIG. 2, the potential at the surface of the semiconductor substrate 1 is shifted from the solid line A to the broken line B by the presence of the potential control film 13. In this situation, the potential at the surface of the semiconductor substrate 1 is shifted toward high energy when viewed from the electron. This means that the repulsive force which electrons receive from the potential shifted toward high energy at the surface of the semiconductor substrate 1 is increased. This causes the current path through which the electrons flow to shift from "the surface of the semiconductor substrate 1" to "the inner part of the semiconductor substrate 1 (inside the bulk)." This means that the current path through which the electrons flow moves away from the interface between the step insulating film and the semiconductor substrate, thereby suppressing the injection of hot carriers into the step insulating film.

Figure 3:
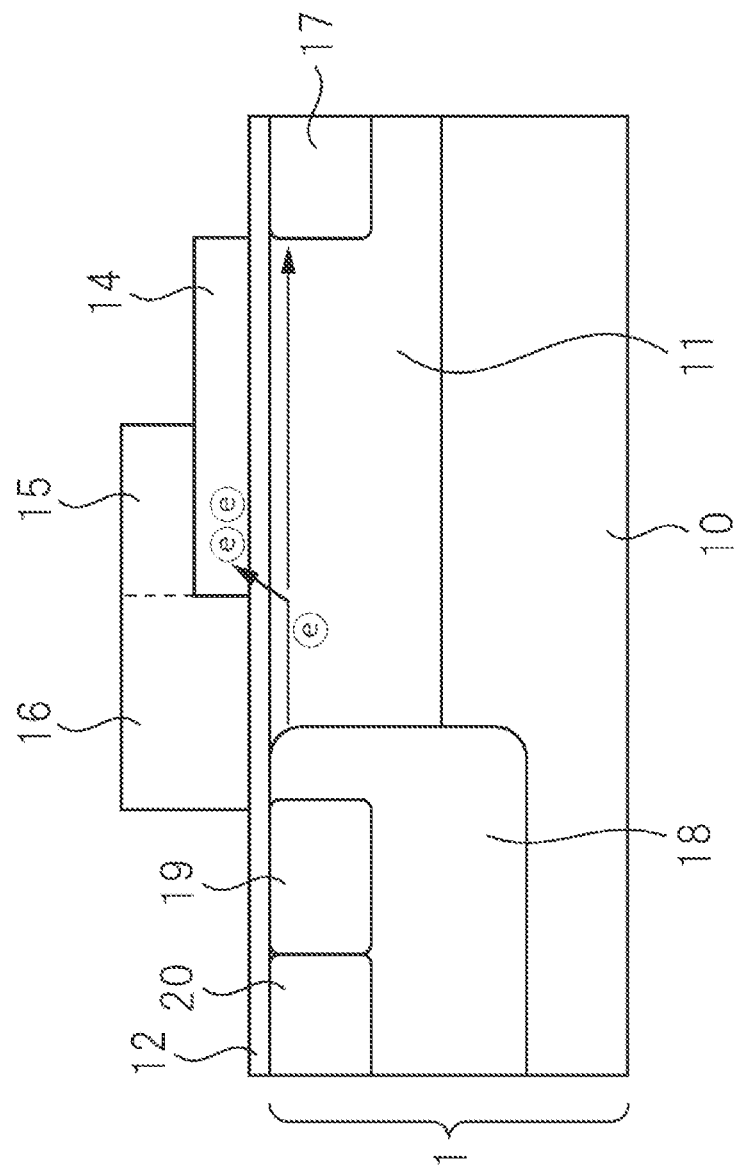
FIG. 3 is a diagram schematically showing a state in which electrons flow in LDMOSFET where the potential control film is not existed.

For example, FIG. 3 is a diagram schematically showing a state in which electrons flow in a LDMOSFET where the potential control film 13 is not provided.

As shown in FIG. 3, electrons flow from the source region 19 through the channel formed on the surface of the p-type body region 18 toward the drain region 17. At this time, as shown in FIG. 3, hot carriers generated by the high voltage applied between the drain region 17 and the source region 19 are injected into the step insulating film 14 by the high electric field in the vicinity of the corner portion of the step insulating film 14. As a result, in LDMOSFET shown in FIG. 3, the on-resistance caused by the hot carriers injected into the step insulating film 14 is increased.

Figure 4:
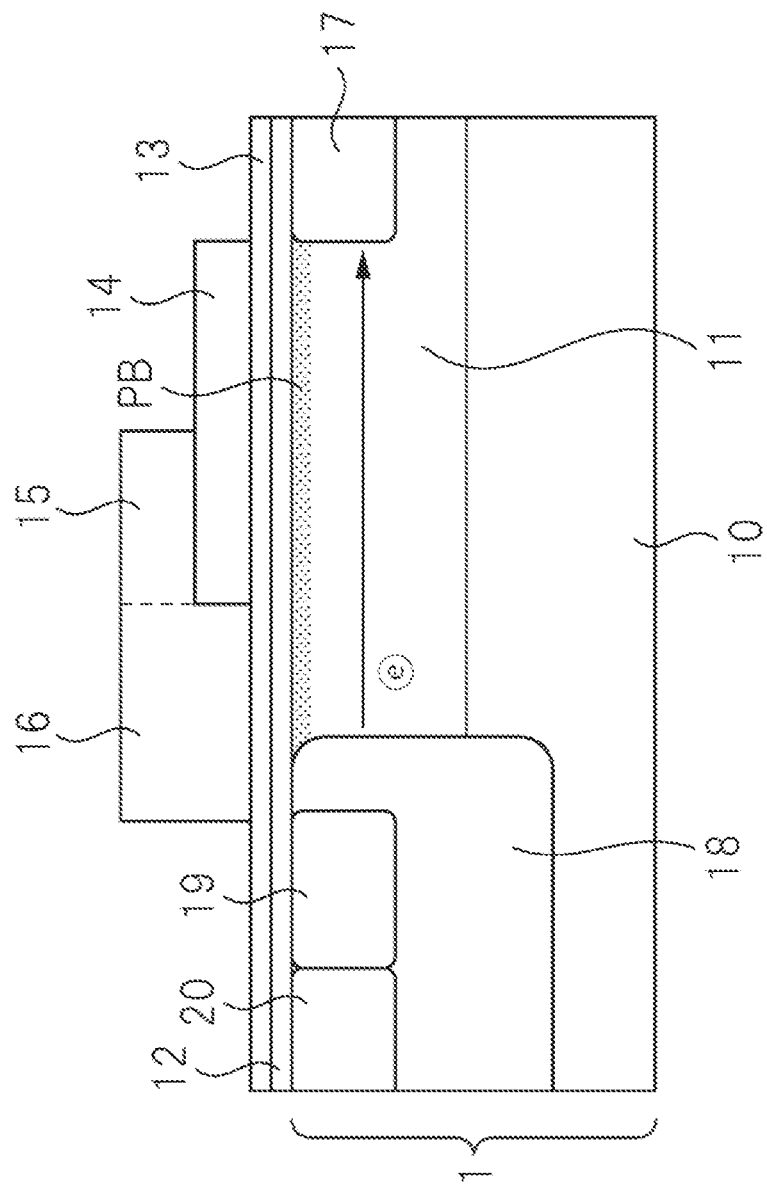
FIG. 4 is a diagram schematically showing a state in which electrons flow in LDMOSFET in which the basic concept of providing a potential control film is embodied.

On the other hand, FIG. 4 is a diagram schematically showing a state in which electrons flow in a LDMOSFET in which the basic concept of providing the potential control film 13 is embodied.

As shown in FIG. 4, electrons flow from the source region 19 through a channel formed on the surface of the p-type body region 18 toward the drain region 17. At this time, in LDMOSFET shown in FIG. 4, the potential control film 13 forms a potential barrier PB that exerts a repulsive force on electrons on the surface of the semiconductor substrate 1. Consequently, as shown in FIG. 4, the current path through which the electrons flow shifts from "the surface of the semiconductor substrate 1" to "the inner part of the semiconductor substrate 1 (inside the bulk)." As a result, the current path through which the electrons flow is moved away from the interface between the step insulating film 14 and the semiconductor substrate 1, so that the hot carriers are suppressed from being injected into the step insulating film 14. Therefore, in LDMOSFET shown FIG. 4, it is possible co suppress the increase of the on-resistance caused by the injection of hot carriers into the step insulating film 14.

From the above, it can be seen that the basic concept of forming potential barrier PB for electrons on the surface of the semiconductor substrate 1 located under the step insulating film 14 by the potential control film 13 is an effective technical idea from the viewpoint of reducing on-resistance. Hereinafter, an example of an implementation mode in which this basic concept is embodied will be described.

Device Structure of LDMOSFET

Figure 5:
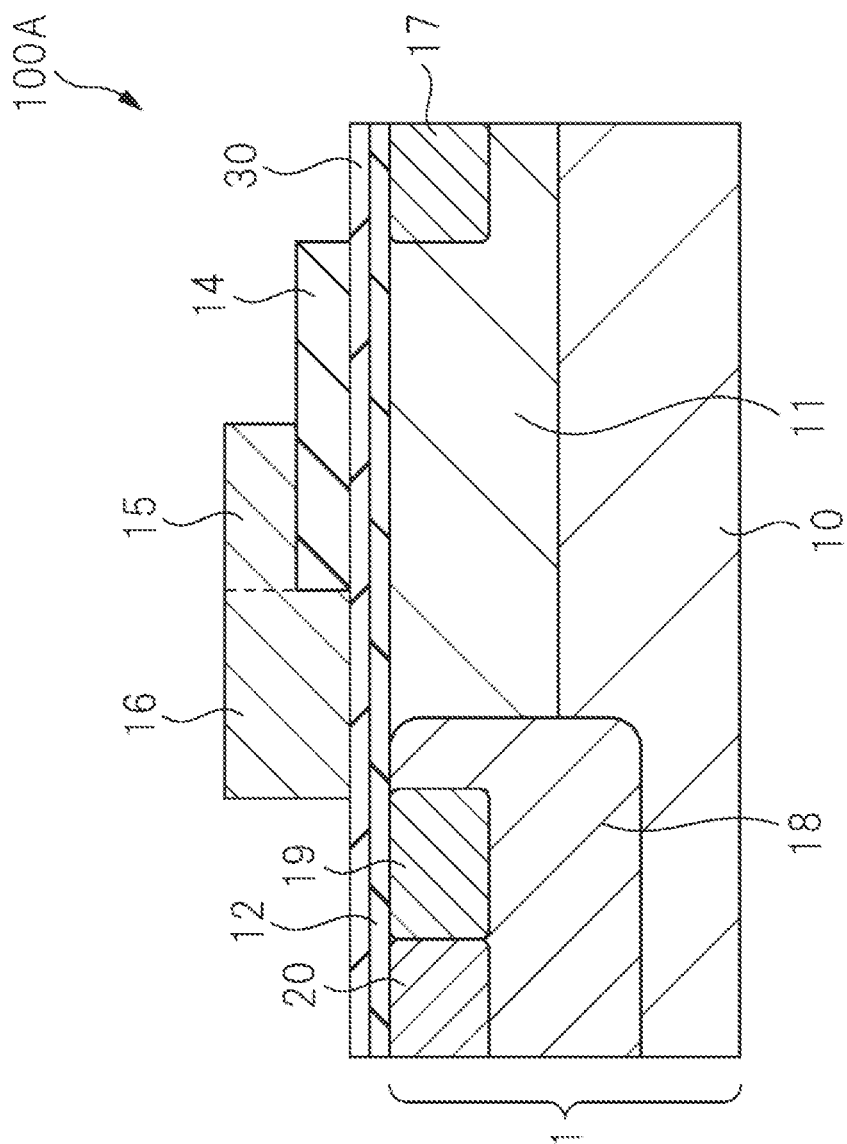
FIG. 5 is a cross-sectional view showing the device structure of LDMOSFET in the present embodiment.

FIG. 5 is a cross-sectional view showing the schematic device structure of LDMOSFET 100A.

In FIG. 5, LDMOSFET has, for example, a semiconductor substrate 1 made of silicon. The semiconductor substrate 1 has a p-type resurf layer 10, and an n-type resurf layer 11 formed on the p-type resurf layer 10 (n-type drift layer). A gate dielectric film 12 formed of, for example, a silicon oxide film is formed on the semiconductor substrate 1.

A gate electrode 16 formed of, for example, an n-type polysilicon film is formed on the gate dielectric film 12. Here, "the gate electrode 16 formed "on" the gate dielectric film 12" is used in a broad intention including not only the configuration of the gate electrode 16 formed directly above the gate dielectric film 12, but also, for example as shown in FIG. 5 the configuration in which a high dielectric constant film 30 is formed on the gate dielectric film 12 and the gate electrode 16 is formed on the high dielectric constant film 30.

Specifically, in FIG. 5, a high dielectric constant film 30 is formed on the gate dielectric film 12, the gate electrode 16 is formed on the high dielectric constant film 30.

Here, the "high dielectric constant film 30" in this specification is defined as a film having a dielectric constant higher than that of silicon. In the present embodiment, as shown in FIG. 5, the high dielectric constant film 30 includes a "first portion" sandwiched between the gate dielectric film 12 and the gate electrode 16, and a "second portion" sandwiched between the step insulating film 14 and the gate dielectric film 12.

Next, LDMOSFET 100A includes a field plate portion 5 which is integrally formed with the gate electrode 16, and a step insulating 14 in contact with the field plate portion 15. The step insulating film 14 is formed of, for example, a silicon oxide film. The high dielectric constant film 30 is in contact with the step insulating film 14.

Subsequently, as shown in FIG. 5, a drain region 17 formed of an n-type semiconductor region aligned with the step insulating film 14 is formed in the n-type resurf layer 11. Furthermore, the p-type body region 18 formed of a p-type semiconductor region is formed in the semiconductor substrate 1, and in the p-type body region 18, the source region 19 which is an n-type semiconductor region and the body contact region 20 which is a p-type semiconductor region, are formed. The source region 19 and the body contact region 20 are electrically connected to each other, and, for example, a ground potential of 0 V is supplied thereto. As a result, the ground potential is also supplied to the p-type body region 18 electrically connected to the body contact region 20. On the other hand, a positive potential is supplied to the drain region 17.

Here, the high dielectric constant film 30 shown in FIG. 5 is an example of the potential control film 13 shown in FIG. 2. That is, the high dielectric constant film 30 functions as the potential control film 13 for forming a potential barrier for electrons on the surface of the semiconductor substrate 1 located under the step insulating film 14. More specifically, as will be described later, the high dielectric constant film 30 has a function of forming a potential barrier on the surface by shifting the Fermi level on the surface of the semiconductor substrate 1 located under the step insulating film 14. The high dielectric constant film 30 having such a function includes, for example, any of HfSiO, HfSiON, HfAlON, $Y_2O_3$ or $Al_2O_3$.

As described above, LDMOSFET 100A is configured.

Operation of LDMOSFET

Next, the operation of LDMOSFET 100A is described, First, the on-operation of LDMOSFET 100A will be described. In FIG. 5, in a state of supplying a positive potential to the drain region 17 while supplying a ground potential to the source region 19, a gate voltage above the threshold voltage is applied to the gate electrode 16. Then, the inversion layer (n-type layer) serving as a channel layer is formed on the surface of the p-type body region 18 located under the gate electrode 16. Thus, electrons flow in the path of the source region 19, channel layer (inversion layer), n-type resurf layer 11 and drain region 17 in this order. In this way, LDMOSFET 100A is operated in on state.

Subsequently, the off-operation of LDMOSFET 100A will be described. In the on-state of LDMOSFET 100A, a smaller gate voltage (e.g., 0V) than the threshold voltage is applied to the gate electrode 16. Then, the inversion layer formed on the surface of the p-type body region 18 disappears. As a result, the path of the flow of electrons from the source region 19 to the drain region 17 is blocked. In this way, LDMOSFET 100A is turned off.

Feature in the Present Embodiment

Next, the feature points in the present embodiment will be described.

The feature point in the present embodiment is that, for example, as shown in FIG. 5, a high dielectric constant film 30 is employed as a potential control film 13 for forming a potential barrier for electrons on the surface of the semiconductor substrate 1 located under the step insulating film 14. In other words, the feature point in the present embodiment is that a potential barrier is formed on the surface of the semiconductor substrate 1 located under the step insulating film 14 by the high dielectric constant film 30, and that the current path through which electrons flow is shifted from "the surface of the semiconductor substrate" to "the inner part of the semiconductor substrate (inside the bulk)" by this potential barrier. As a result, according to the present embodiment, the path through which electrons flow can be moved away from the interface between the step insulating film 14 and the semiconductor substrate 1, thereby suppressing hot carriers from being injected into the step insulating film 14. As a result, according to the present embodiment, it is possible to effectively suppress an increase of the on-resistance of LDMOSFET caused by the injection of hot carriers into the step insulating film 14.

Hereinafter, it will be described that the high dielectric constant film 30 functions as the potential control film 13.

Figure 6A:
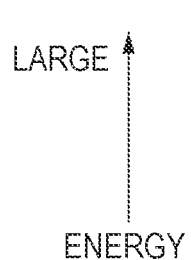
FIG. 6A is a figure schematically showing a band structure at the surface of the n-type resurf layer when, for example, a gate dielectric film made of a silicon oxide film is formed on the n-type resurf layer.

FIG. 6A is a diagram schematically showing a band structure at the surface of the n-type resurf layer 11 when the gate dielectric film 12 formed of, for example, a silicon oxide film is formed on the n-type resurf layer 11. As shown in FIG. 6A, since the n-type resurf layer 11 is the n-type semiconductor layer, the Fermi level Ef is present in the vicinity of the lower end of conduction band.

Figure 6B:
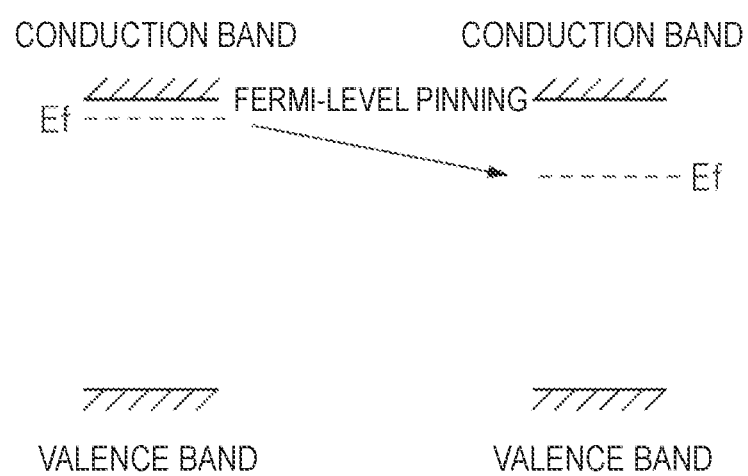
FIG. 6B is a figure schematically showing a band structure at the surface of the n-type resurf layer when a gate dielectric film made of a silicon oxide film and a high dielectric constant film are formed on the n-type resurf layer.

However, on the n-type resurf layer 11, not only the gate dielectric film 12 formed of a silicon oxide film but also a high dielectric constant film 30 including, for example, HfSiO, HfSiON, HfAlON, Y2O3, or Al2O3 or the like in the constituent material and having a dielectric constant higher than that of silicon on this gate dielectric film 12 are formed, Fermi level Ef is moved away from the lower end of the conduction band, so-called "Fermi level pinning" phenomena occurs. Specifically, FIG. 6B is a diagram schematically showing a band structure on the surface of the n-type resurf layer 11 when the gate dielectric film 12 formed of a silicon oxide film and the high dielectric constant film 30 are formed on the n-type resurf layer 11. As shown in FIG. 6B, despite the n-type resurf layer 11 is n-type semiconductor layer, by "Fermi level pinning" due to the presence of the high dielectric constant film 30, it can be seen that the Fermi level Ef is shifted in a direction away from the lower end of conduction band. In the present embodiment, this "Fermi-level pinning" is used to form a potential barrier on the surface of the semiconductor substrate 1 located under the step insulating film 14. This point will be described below.

Figures 7A, 7B:
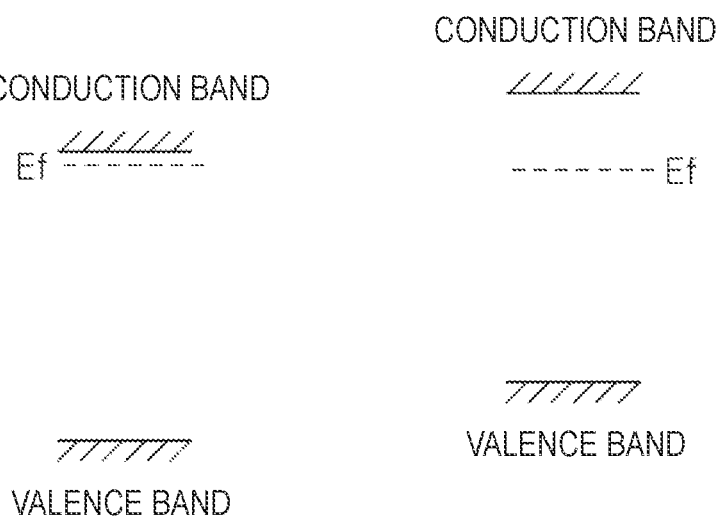
FIGS. 7A and 7B are diagrams schematically showing band structures in which the Fermi levels of FIGS. 6A and 6B are adjusted to the same energy level.

When matching the Fermi level Ef of FIGS. 6A and 6B to the same energy level, the Fermi level is as shown in FIGS. 7A and 7B. FIG. 7A is a diagram schematically showing a band structure at the surface of the n-type resurf layer 11 when, for example, a gate dielectric film 12 formed of a silicon oxide film is formed on the n-type resurf layer 11, and FIG. 7S is a diagram schematically showing a band structure at the surface of the n-type resurf layer 11 when a gate dielectric film 12 formed of a silicon oxide film and high dielectric constant film 30 are formed on the n-type resurf layer 11.

From FIGS. 7A and 7B, when forming a high dielectric constant film 30 on the n-type resurf layer 11, it can be seen by "Fermi level pinning", the band structure at the surface of the n-type resurf layer 11 shifts a direction of electrically high energy. This means that by providing the high dielectric constant film 30, the energy level of the surface of the n-type resurf layer 11 is electrically raised, in other words, it means that the potential barrier for electrons is formed on the surface of the semiconductor substrate 1 located under the step insulating film 14. By such a mechanism, it is understood that the dielectric constant film 30 functions as the potential control film 13.

As described above, it can be said that the feature point in the present embodiment is that the potential barrier is formed on the surface of the semiconductor substrate 1 located under the step insulating film 14 by utilizing the phenomena "Fermi level pinning" caused by the high dielectric constant film 30. With this feature point, the path through which electrons flow can be moved away from the interface between the step insulating film 14 and the semiconductor substrate 1 by the repulsive force caused by the potential barrier. Therefore, according to the present embodiment, it is possible to suppress injection of hot carriers into the step insulating film 14, and as a result, it is possible to suppress an increase of on-resistance of LDMOSFET caused by injection of hot carriers into the step insulating film 14.

Method of Manufacturing Semiconductor Device Including LDMOSFET

Next, a method of manufacturing a semiconductor device including LDMOSFET will be described.

Figure 8:
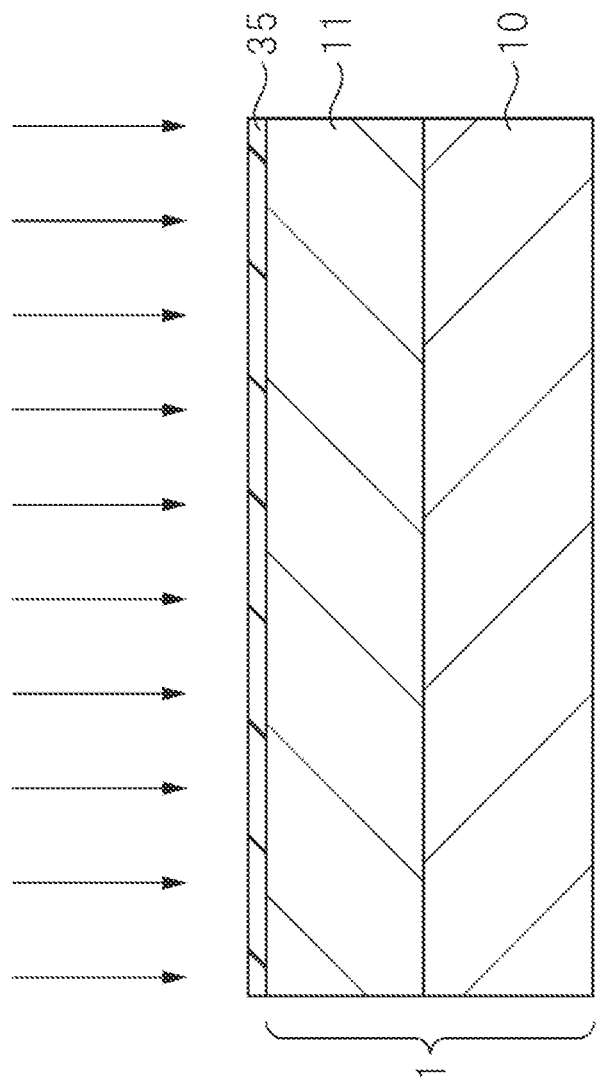
FIG. 8 is a cross-sectional view showing a manufacturing process of semiconductor device in the present embodiment.

First, as shown in FIG. 8, for example, a semiconductor substrate 1 made of silicon is prepared. After a sacrificial silicon oxide film. 35 is formed on the semiconductor substrate 1, a p-type resurf layer 10 and an n-type resurf layer 11 are formed in the semiconductor substrate 1 by ion implantation. Specifically, the p-type resurf layer 10 is formed by implanting boron as a p-type impurity (acceptor) into the semiconductor substrate 1. On the other hand, the n-type resurf layer 11 is formed by implanting phosphorus (P), which is an n-type impurity (donor), into the semiconductor substrate 1.

Figure 9:
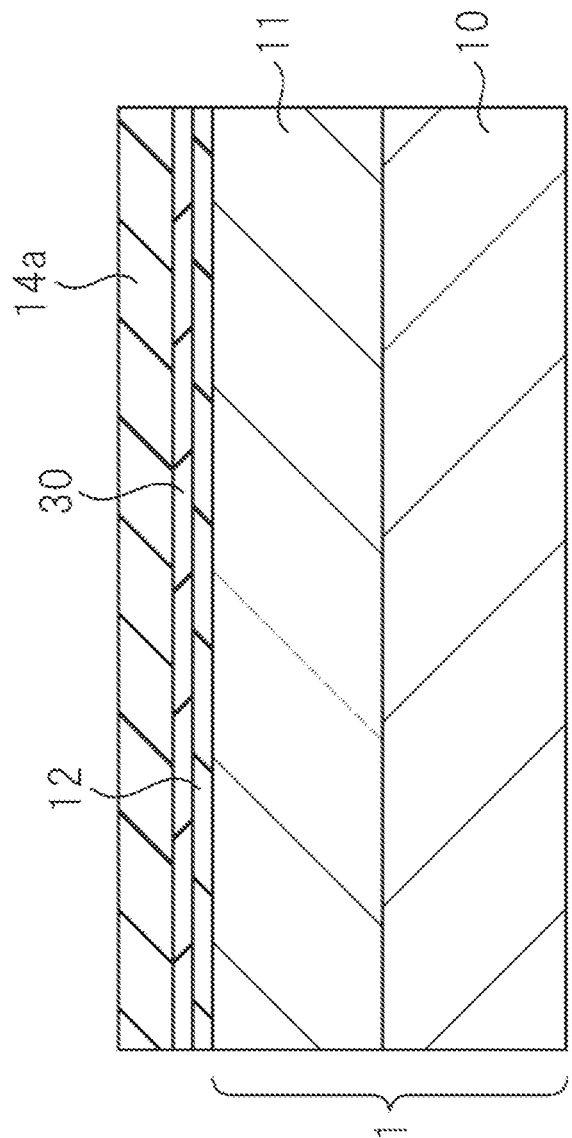
FIG. 9 is a cross-sectional view showing the manufacturing process of semiconductor device following FIG. 8.

Next, as shown in FIG. 9, a gate dielectric film 12 formed of a silicon oxide film is formed on the semiconductor substrate 1 by using, for example, a thermal oxidation method. Thereafter, a high dielectric constant film 30 formed by using an ALD (Atomic Layer Deposition) method or a CVD (Chemical Vapor Deposition) method. As the high dielectric constant film 30, for example, HfSiO film, HfSiON film, HfAlON film, $Y_2O_3$ film, and $Al_2O_3$ film can be mentioned. Then, for example, by using a CVD method, a silicon oxide film 14a is formed on the high dielectric constant film 30.

Figure 10:
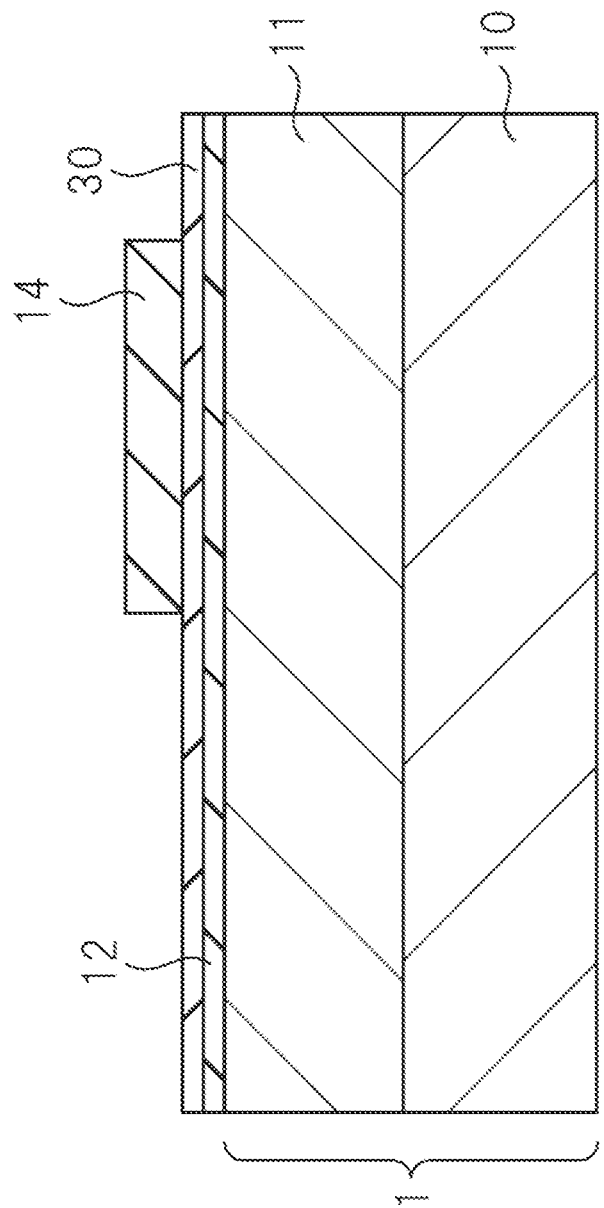
FIG. 10 is a cross-sectional view showing the manufacturing process of semiconductor device following FIG. 9.
Figure 11:
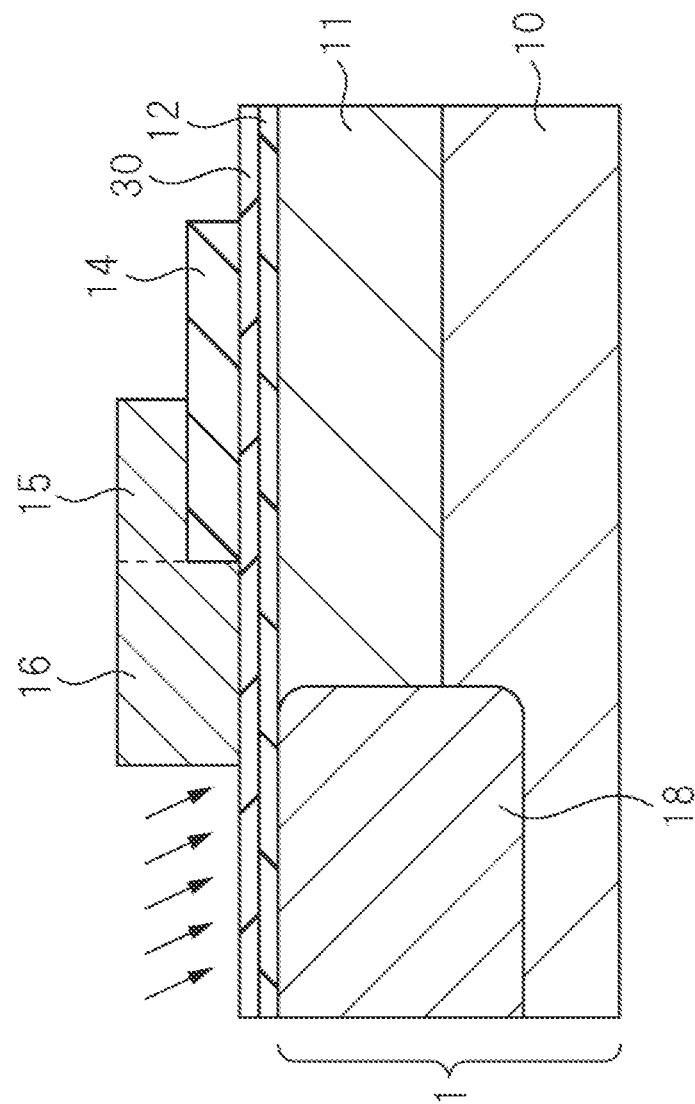
FIG. 11 is a cross-sectional view showing the manufacturing process of semiconductor device following FIG. 10.

Subsequently, as shown in FIG. 10, the silicon oxide film 14a is patterned by using a photolithography technique and an etching technique to form a step insulating film 14. Next, a polysilicon film is formed on the high dielectric constant film 30 so as to cover the step insulating film 14 by using, for example, a CVD method. Then, the polysilicon film is patterned by using photolithography and etching techniques. Thus, a gate electrode 16 and the field plate portion 15 which are formed of a polysilicon film are integrally formed. Thereafter, boron, which is a p-type impurity, is implanted into the semiconductor substrate 1 by using a photolithography technique and an oblique ion implantation method to form a p-type body region 18.

Next, as shown in FIG. 5, phosphorus which is an n-type impurity is implanted into the semiconductor substrate 1 to form a drain region 17 and a source region 19, and boron, which is a p-type impurity, is implanted into the semiconductor substrate 1 to form a body contact region 20 by using a photolithography technique and an ion implantation method. Thereafter, through an interlayer insulating film forming step to form interlayer insulating films and a wiring forming step to form wirings, it is possible to manufacture a semiconductor device including LDMOSFET 100A.

First Modified Example

In the above embodiment, for example, as shown in FIG. 5, the high dielectric constant film 30 includes a "first portion" sandwiched between the gate dielectric film 12 and the gate electrode 16, and a "second portion" sandwiched between the step insulating film 14 and the gate dielectric film 12.

Here, the "second portion" of the high dielectric constant film 30 is important from the viewpoint of forming the potential barrier for electrons on the surface of the semiconductor substrate 1 located under the step insulating film 14. On the other hand, the "first portion" of the high dielectric constant film 30 configures a stacked film with the gate dielectric film 12, and this stacked film influences threshold voltage for forming an inversion layer. That is, the "first portion" of the high dielectric constant film 30 is not essential from the viewpoint of forming the potential barrier for electrons on the surface of the semiconductor substrate 1 located under the step insulating film 14. Rather, there is a disadvantage that the threshold voltage for forming the inversion layer is increased the "Fermi level pinning" caused by the "first portion" of the high dielectric constant film 30.

Figure 12:
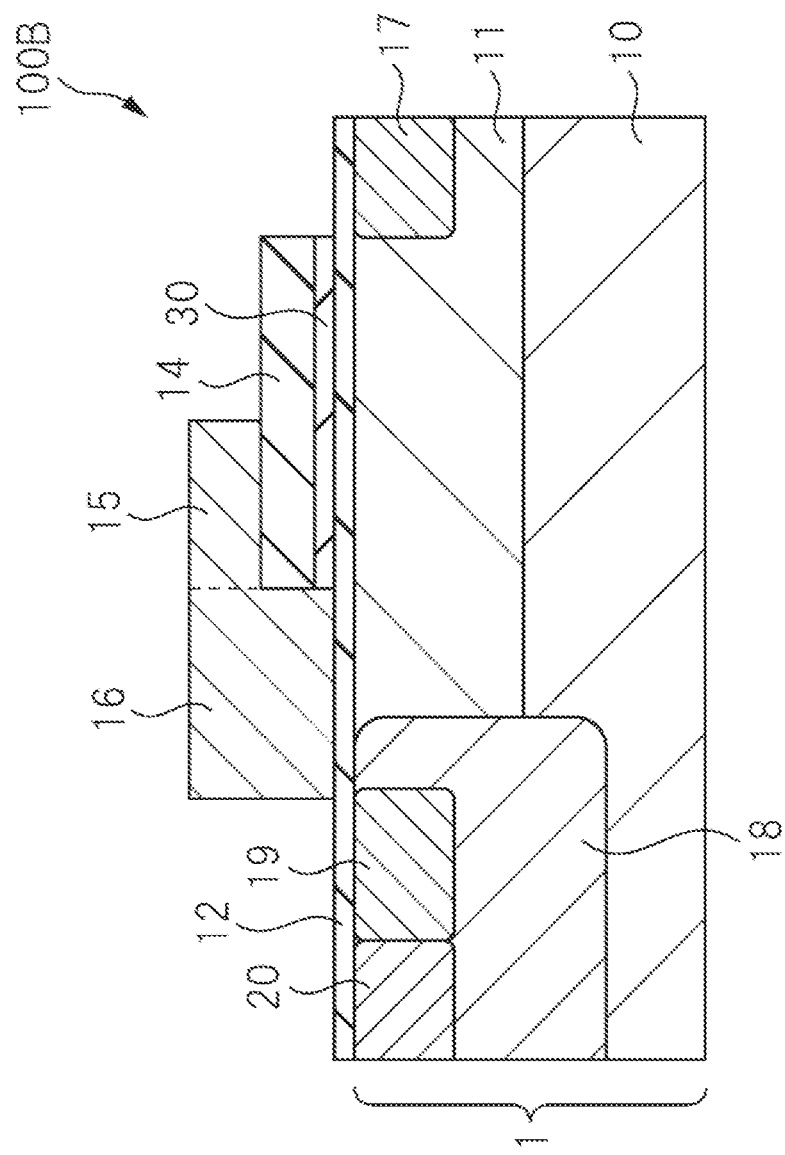
FIG. 12 is a cross-sectional view showing the device structure of LDMOSFET in the first modified example.

Therefore, FIG. 12 is a cross-sectional view schematically showing the device structure of LDMOSFET 1003 in the present first modified example. As shown in FIG. 12, the high dielectric constant film 30 is composed of only the "second portion" sandwiched between the step insulating film 14 and the gate dielectric film 12. As a result, according to the present first modified example, it is possible to form the potential barrier for electrons on the surface of the semiconductor substrate 1 located under the step insulating film 14, while suppressing the side effect that the threshold voltage for forming the inversion layer increases.

Method of Manufacturing Semiconductor Device Including LDMOSFET

Figure 13:
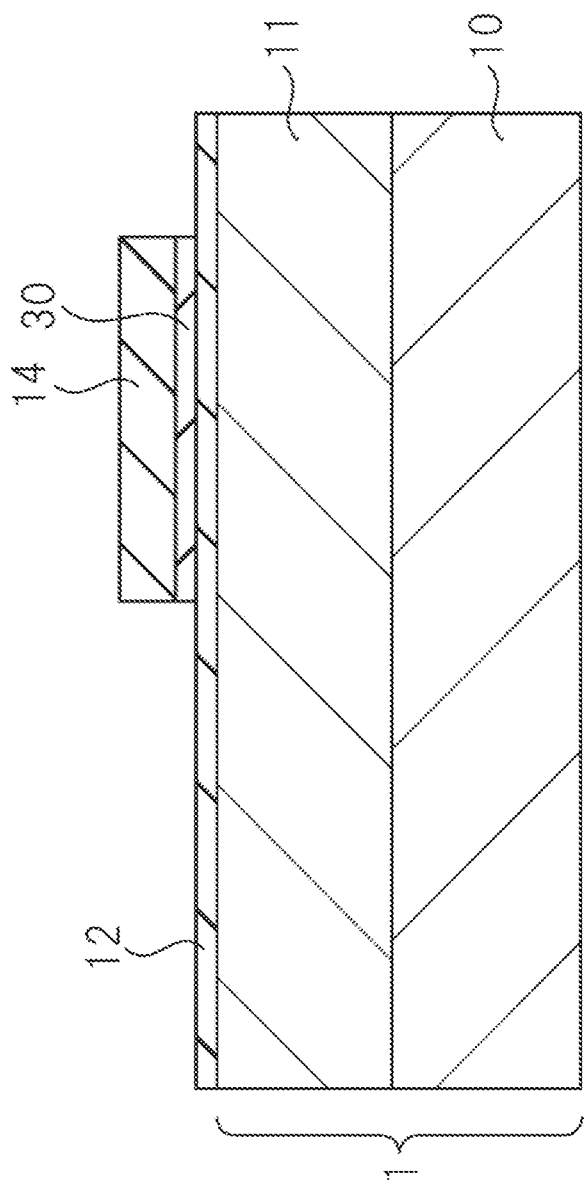
FIG. 13 is a cross-sectional view showing the manufacturing process of semiconductor device in the first modified example.
Figure 14:
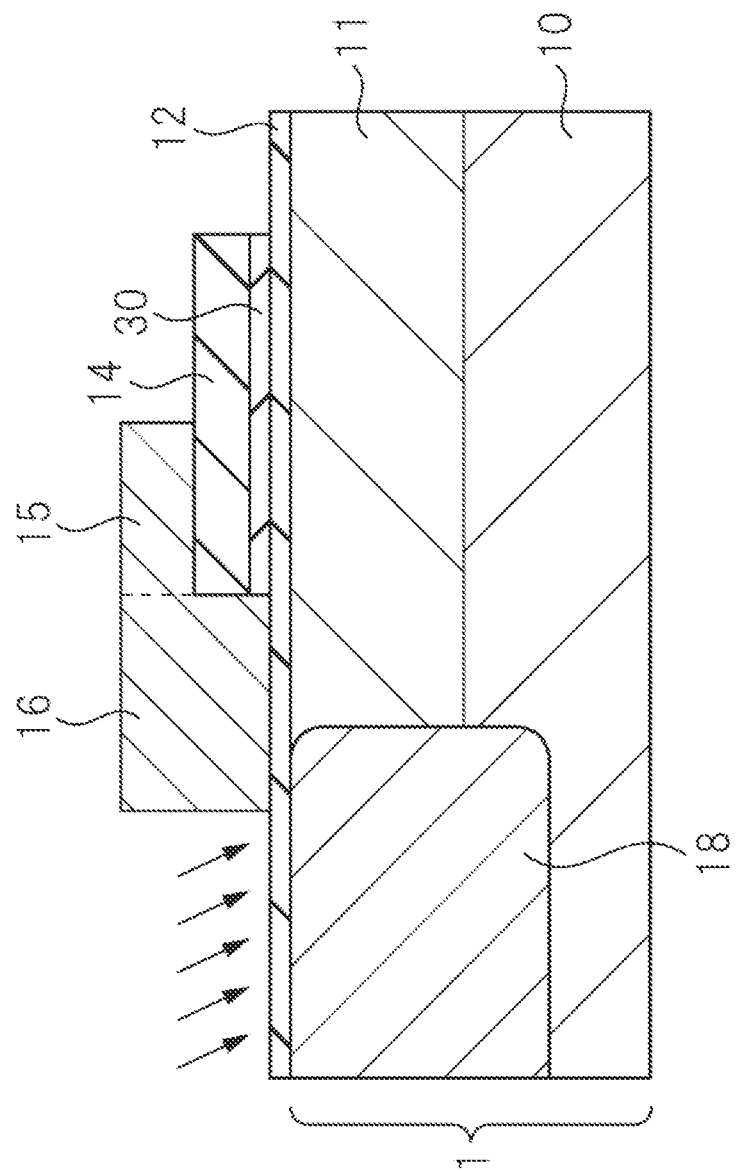
FIG. 14 is a cross-sectional view showing the manufacturing process of semiconductor device following FIG. 13.

In the semiconductor device including LDMOSFET in the present first modified example, the steps shown in FIGS. 8 and 9 are the same as in the above embodiment. Next, as shown in FIG. 13, the high dielectric constant film 30 exposed from the step insulating film 14 is removed by using an etching technique. As a result, the high dielectric constant film 30 composed of only the "second portion" sandwiched between the step insulating film 14 and the gate dielectric film 12 can be formed.

Subsequently, a polysilicon film is formed on the gate dielectric film 12 so as to cover the step insulating film 14 by using, for example, a CVD method. Then, the polysilicon film is patterned by using photolithography and etching techniques. Thus, a gate electrode 16 and a field plate portion 15 which are formed of a polysilicon film are integrally formed. Thereafter, boron, which is a p-type impurity, is implanted into the semiconductor substrate 1 by using a photolithography technique and an oblique ion implantation method to form the p-type body regions 18.

Next, as shown FIG. 12, phosphorus which is an n-type impurity is implanted into the semiconductor substrate 1 to form the drain region 17 and the source region 19, and boron, which is a p-type impurity, is implanted into the semiconductor substrate to form the body contact region 20 by using a photolithography technique and an ion implantation method. Thereafter, through the interlayer insulating film forming step to form the interlayer insulating films and wiring forming step to form the wirings, it is possible to manufacture semiconductor device including LDMOSFET 100B.

Second Modified Example

Device Structure of LDMOSFET

Figure 15:
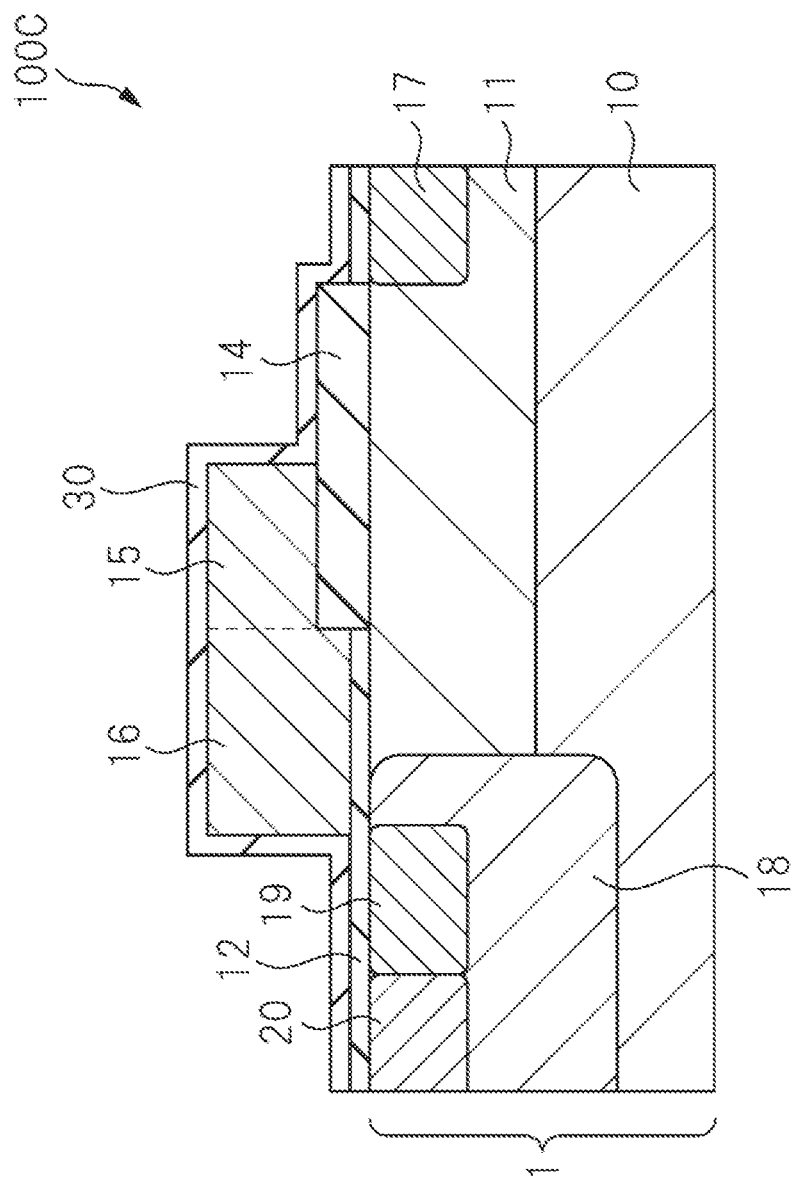
FIG. 15 is a cross-sectional view showing the device structure of LDMOSFET in the second modified example.

FIG. 15 is a cross-sectional view schematically showing the device structure of LDMOSFET 1000 in the present second modified example. In FIG. 15, the feature point in the second modified example is that a high dielectric constant film 30 is formed over the exposed gate dielectric film 12, the gate electrode 16, the field plate portion 15, and the exposed step insulating film 14. In particular, the film thickness of the high dielectric constant film 30 in the present second modified example is thicker than the film thickness of the high dielectric constant film 30 in the above embodiment and the first modified example. This is because ensuring the effect of forming potential barrier by increasing the film thickness of the high dielectric constant film 30 in the present second modified example, considering that the effect of forming a potential barrier on the surface of the semiconductor substrate 1 is decreased as a result of the high dielectric constant film 30 is disposed above rather than under the step insulating film 14. In this manner, LDMOSFET 100C in the present second modified example is configured.

Method of Manufacturing Semiconductor Device including LDMOSFET

Figure 16:
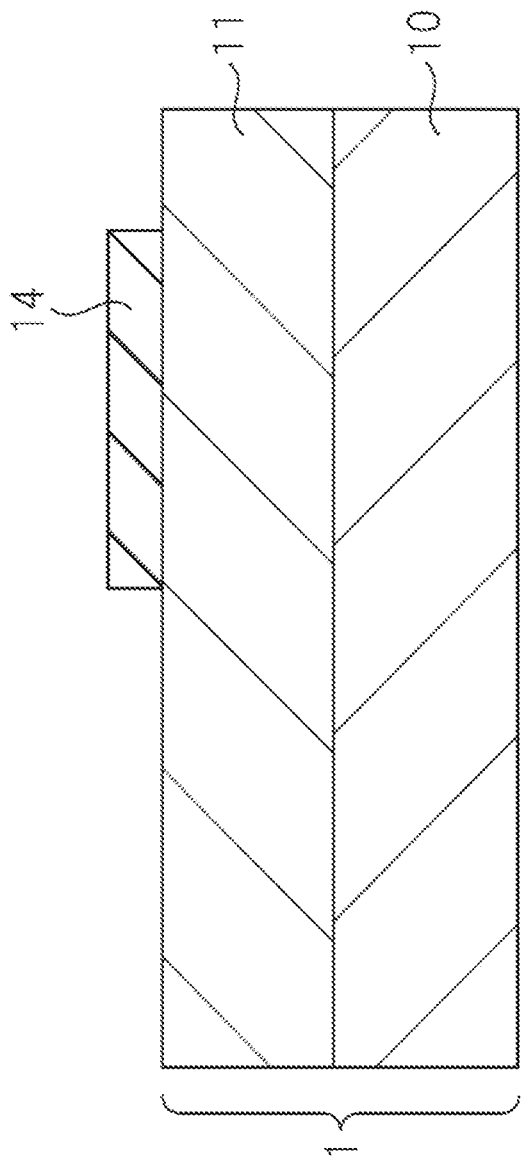
FIG. 16 is a cross-sectional view showing the manufacturing process of semiconductor device in the second modified example.
Figure 17:
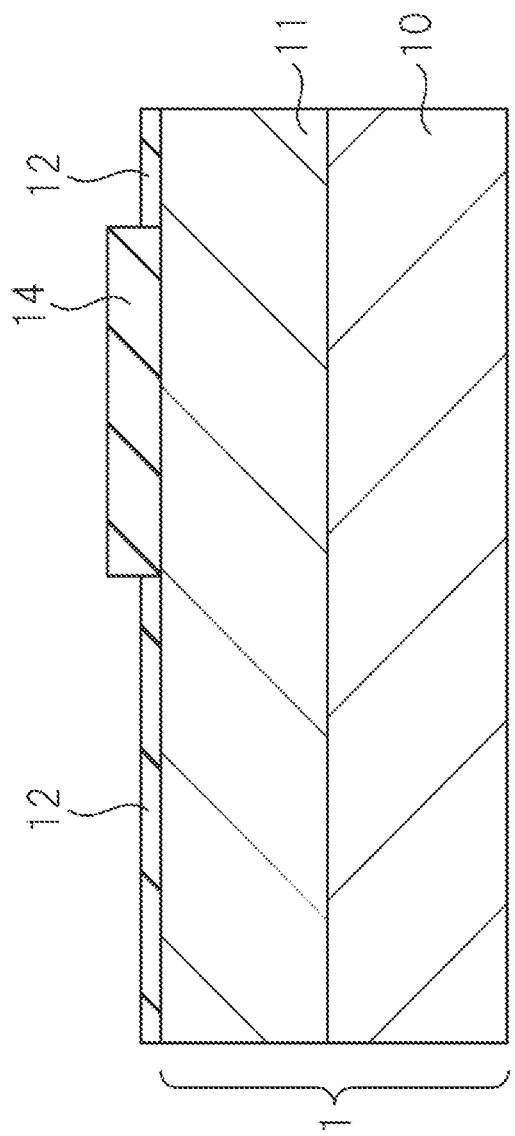
FIG. 17 is a cross-sectional view showing the manufacturing process of semiconductor device following FIG. 16.

In the semiconductor device including LDMOSFET in the present second modified example, the step shown in FIG. 8 is the same as the above embodiment. Next, as shown in FIG. 16, after a silicon oxide film is formed on the semiconductor substrate 1 by using, for example, a CVD method, the silicon oxide film is patterned by using a photolithography technique and an etch technique to form a step insulating film 14. Thereafter, as shown in FIG. 17, a gate dielectric film 12 is formed on the exposed surface of the semiconductor substrate 1 by using, for example, a thermal oxidization method.

Figure 18:
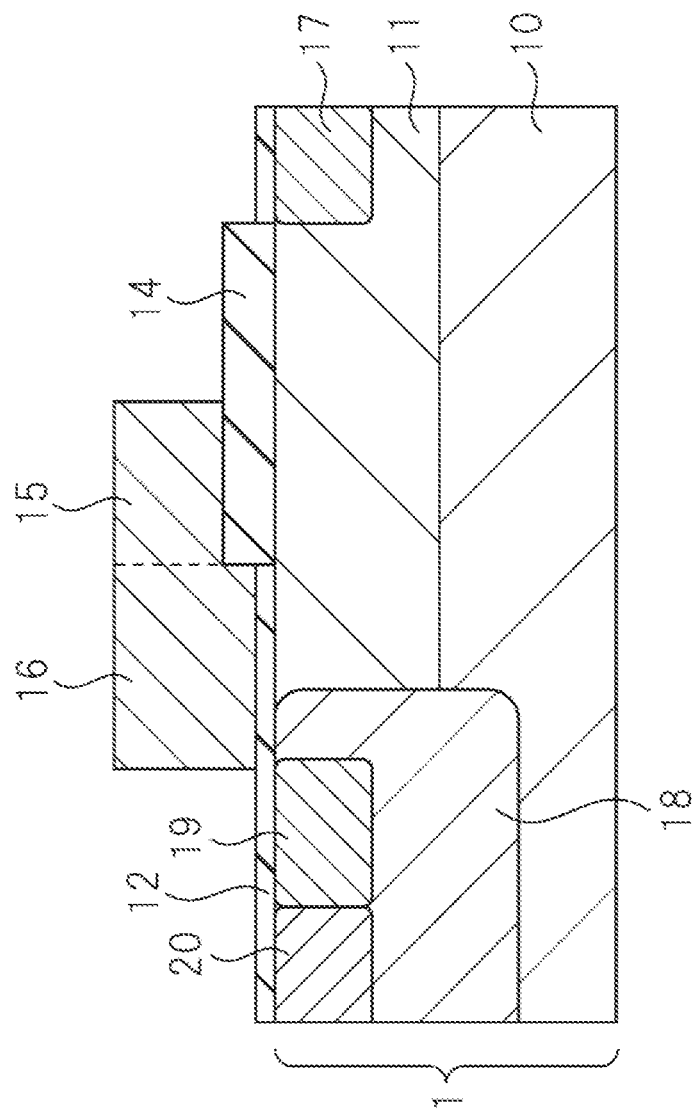
FIG. 18 is a cross-sectional view showing the manufacturing process of semiconductor device following FIG. 17.

Next, as shown in FIG. 18, a polysilicon film is formed on the gate dielectric film 12 and the step insulating film 14 by using, for example, the CVD method. Then, the polysilicon film is patterned by using photolithography and etching techniques. Thus, a gate electrode 16 and a field plate portion 15 formed of the polysilicon film are integrally formed. Thereafter, boron, which is a p-type impurity, is implanted into the semiconductor substrate 1 by using a photolithography technique and an oblique ion implantation method to form the p-type body region 18. Next, by using a photolithography technique and an ion implantation method, phosphorus which is an n-type impurity is implanted into the semiconductor substrate 1 to form the drain region 17 and the source region 19, and boron, which is a p-type impurity, is implanted into the semiconductor substrate 1 to form the body contact region 20. Then, as shown in FIG. 15, a high dielectric constant film 30 is formed so as to cover the exposed gate dielectric film 12, the gate electrode 16, the field plate portion 15, and the exposed step insulating film 14. Thereafter, through the interlayer insulating film forming step to form interlayer insulating films and wiring forming step to form wirings, it is possible to manufacture a semiconductor device including LDMOSFET 100C.

Advantage of Second Modified Example

Also in the present second modified example, while it is possible to form a potential barrier for electrons on the surface of the semiconductor substrate 1 located under the step insulating film 14 by the high dielectric constant film 30 of which the film thickness is thick, it is possible to suppress the side effect that the threshold voltage for forming the inversion layer increased since there is no high dielectric constant film 30 under the gate electrode 16.

In particular, the present second modified example, since the step of patterning the high dielectric constant film 30 is not necessary as in the above-mentioned first modified example, it is possible to suppress an increase of threshold voltage for forming inversion layer without adding a patterning step while forming potential barrier for electrons on the surface of the semiconductor substrate 1 located under the step insulating film 14.

Third Modified Example

Device Structure of LDMOSFET

Figure 19:
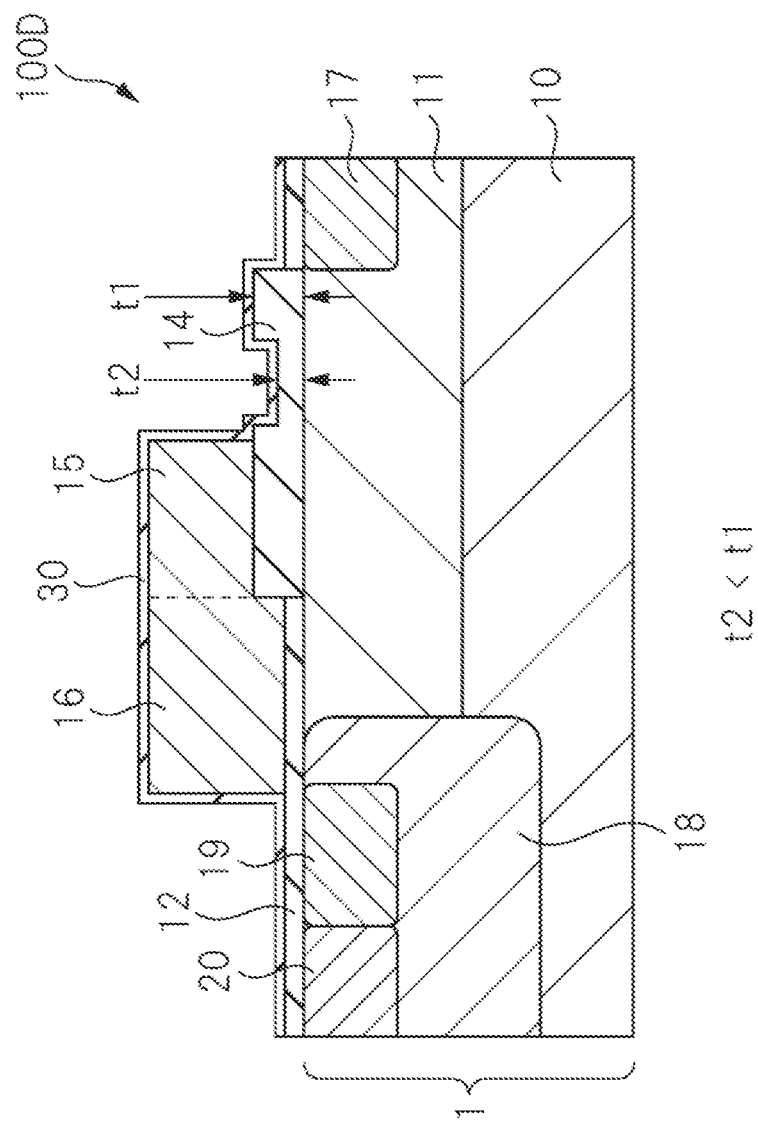
FIG. 19 is a cross-sectional view showing the device structure of LDMOSFET in the third modified example.

FIG. 19 is a cross-sectional view schematically showing the device structure of LDMOSFET 100D in the present third modified example. In FIG. 19, the feature point of the present third modified example is that, as it is premise that the step insulating film 4 has the "contact portion" in contact with the field plate portion 15 and the "non-contact portion" projecting from the field plate portion 15, the "non-contact portion" is configured of the "thin film portion" in which the concave portion is formed and the "thick film portion" which is thicker than the "thin film portion", and that the high dielectric constant film 30 is formed over the exposed gate dielectric film 12, the gate electrode 16, the field plate portion 15, and the exposed step insulating film 14. At this time, when the film thickness of the "thick film portion" is set to "t1" and the film thickness of the "thin film portion" is set to "t2", the relationship of t2<t1 is established.

Method of Manufacturing Semiconductor Device including LDMOSFET

Figure 20:
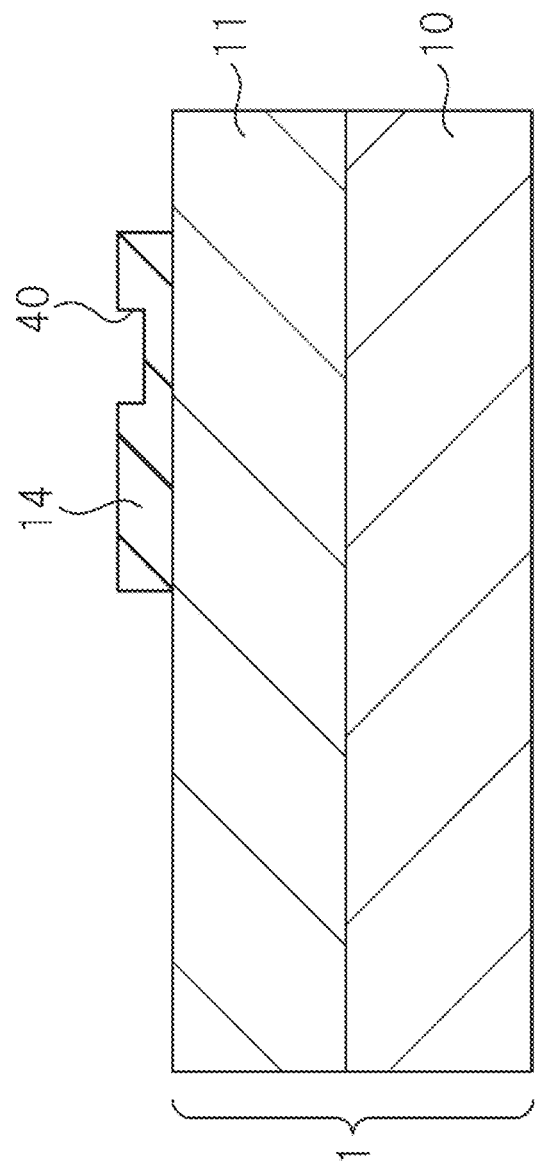
FIG. 20 is a cross-sectional view showing the manufacturing process of semiconductor device in the third modified example.
Figure 21:
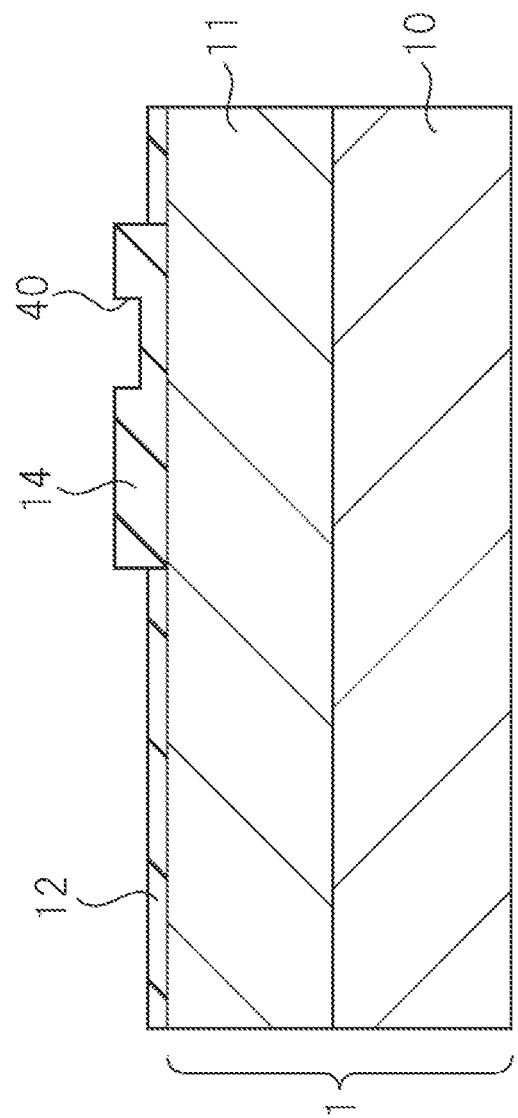
FIG. 21 is a cross-sectional view showing the manufacturing process of semiconductor device following FIG. 20.

In the semiconductor device including LDMOSFET in the third modified example, until the step shown in FIG. 16 is the same as the second modified example. Thereafter, as shown in FIG. 20, a concave portion 40 is formed in the step insulating film 14 by using a photolithography technique and an etching technique. Then, as shown in FIG. 21, a gate dielectric film 12 is formed on the exposed surface of the semiconductor substrate 1 by using, for example, a thermal oxidization method.

Figure 22:
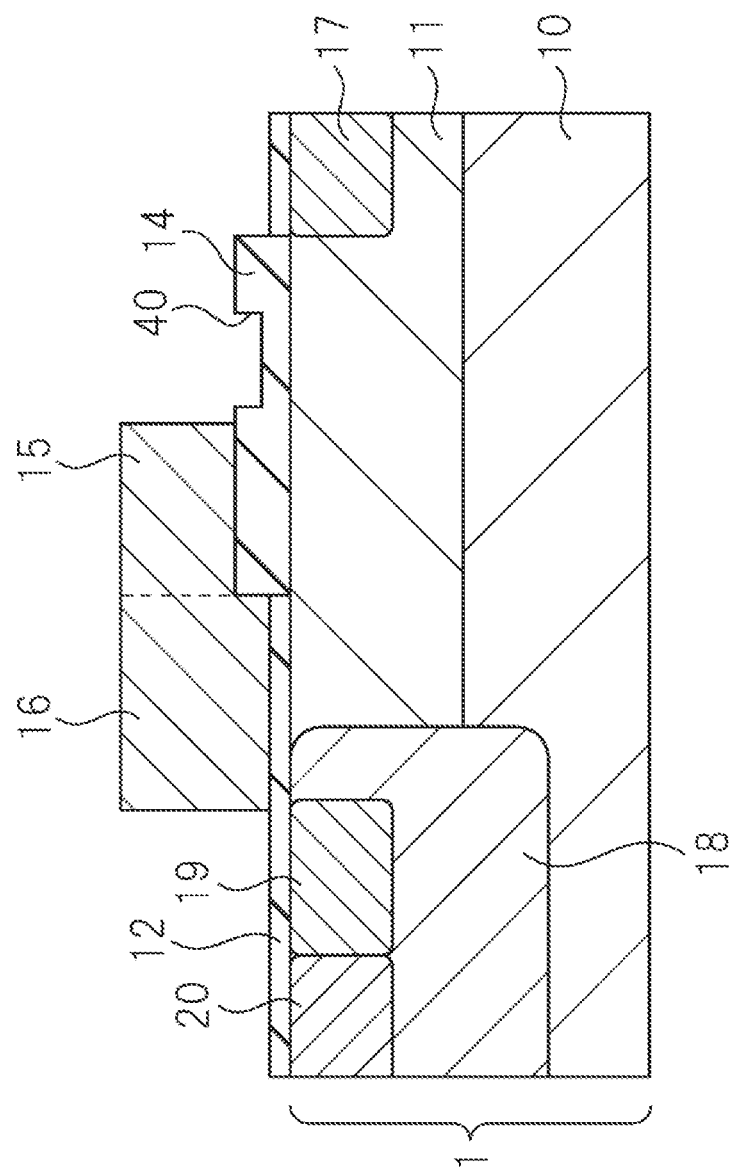
FIG. 22 is a cross-sectional view showing the manufacturing process of semiconductor device following FIG. 21.

Next, as shown in FIG. 22, a polysilicon film is formed on the gate dielectric film and the step insulating film 14 by using, for example, the CVD method. Then, the polysilicon film is patterned by using photolithography and etching techniques. Thus, a gate electrode 16 and a field plate portion 15 formed of the polysilicon film are integrally formed. Thereafter, boron, which is a p-type impurity, is implanted into the semiconductor substrate 1 by using a photolithography technique and an oblique ion implantation method to form the p-type body regions 18. Next, by using a photolithography technique and an ion implantation method, phosphorus which is an n-type impurity is implanted into the semiconductor substrate 1 to form the drain region 17 and the source region 19, and boron, which is a p type impurity, is implanted into the semiconductor substrate 1 to form the body contact region 20. Then, as shown in FIG. 19, a high dielectric constant film 30 is formed so as to cover the exposed gate dielectric film 12, the gate electrode 16, the field plate portion 15, and the exposed step insulating film 14. Thereafter, through the interlayer insulating film forming step to form interlayer insulating films and wiring forming step to form wirings, it is possible to manufacture a semiconductor device including LDMOSFET 100D.

Advantage of Third Modified Example

According to the present third modified example, the "thin film portion" in which the concave portion is formed is formed in the step insulating film 14, and the high dielectric constant film 30 is also formed inside the concave portion of the "thin film portion". In this regard, since it is possible to ensure the effect of forming a potential barrier on the surface of the semiconductor substrate 1, in the present third modified example, the advantage that can reduce the film thickness of the high dielectric constant film 30 than second modified example is obtained.

Fourth Modified Example

Device Structure of LDMOSFET

Figure 23:
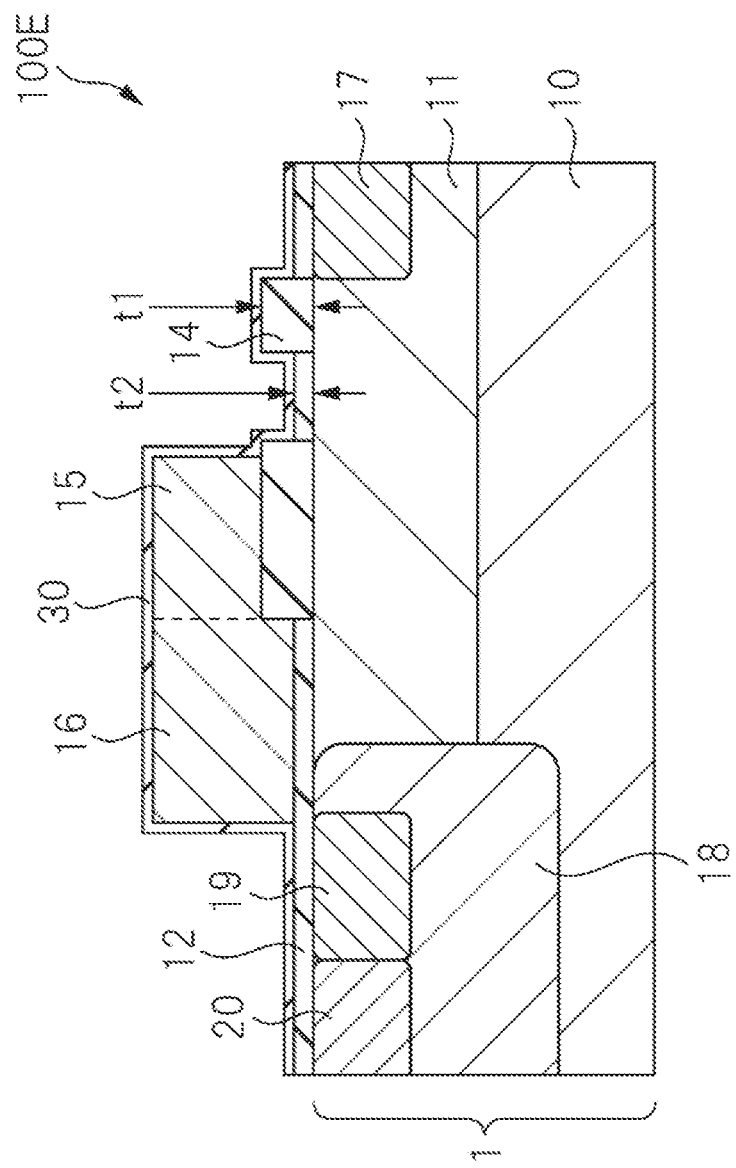
FIG. 23 is a cross-sectional view showing the device structure of LDMOSFET in the fourth modified example.

FIG. 23 is a cross-sectional view schematically showing the device structure of LDMOSFET 100E in the present fourth modified example. In FIG. 23, the feature point of the present fourth modified example is that the film thickness "t2" of the "thin film portion" including the concave portion provided in the step insulating film 14 is equal to the film thickness of the gate dielectric film 12.

Method of Manufacturing Semiconductor Device Including LDMOSFET

Figure 24:
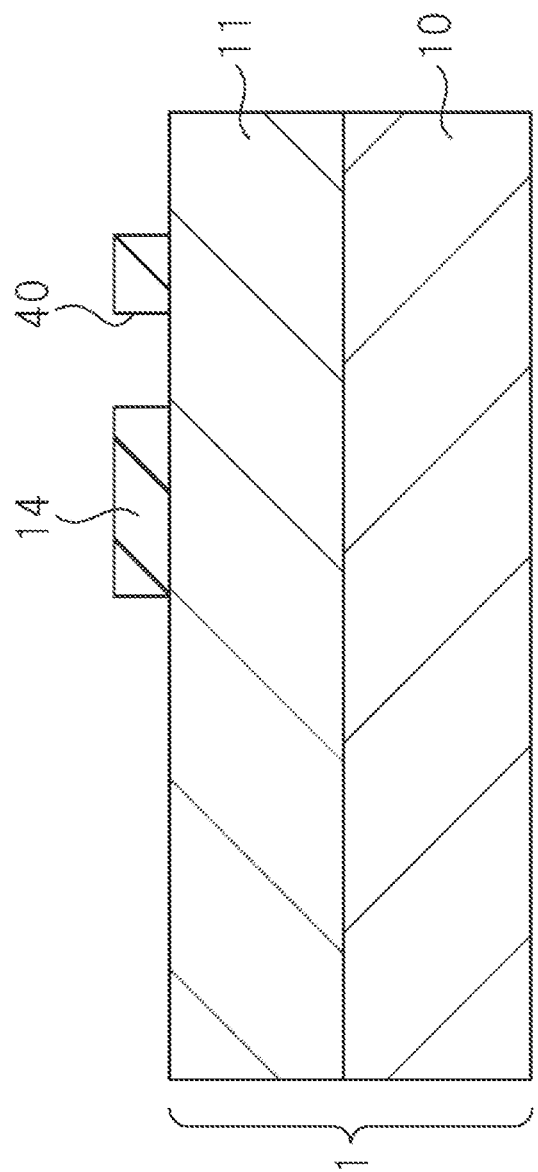
FIG. 24 cross-sectional view showing the manufacturing process of semiconductor device in the fourth modified example.
Figure 25:
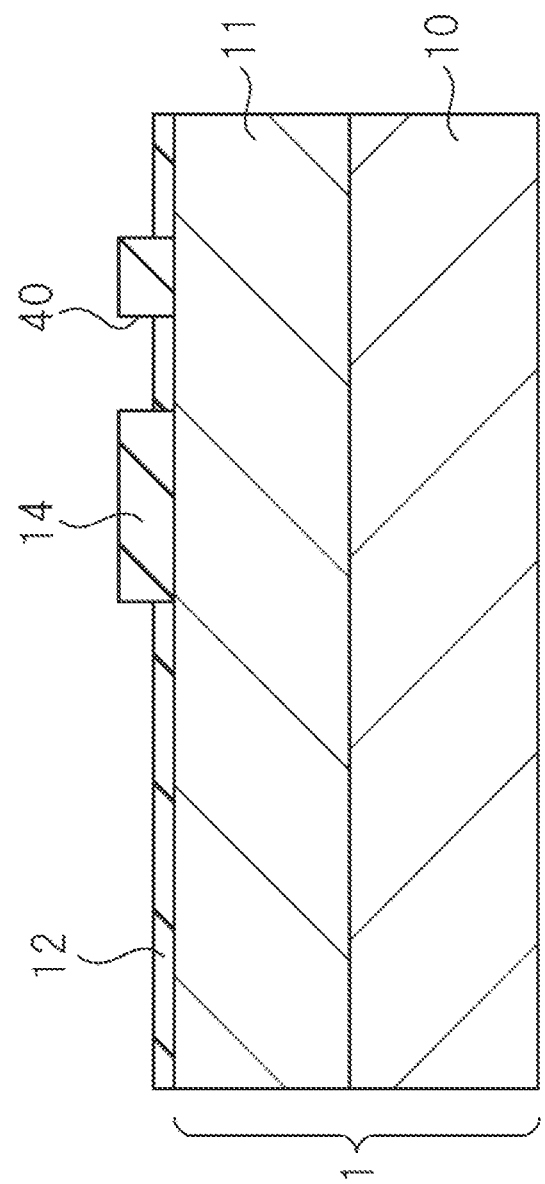
FIG. 25 is a cross-sectional view showing the manufacturing process of semiconductor device following FIG. 24.

In the semiconductor device including LDMOSFET in the present fourth modified example, until the step shown in FIG. 16 is the same as the second modified example. Thereafter, as shown in FIG. 24, a concave portion 40 is formed in the step insulating film 14 by using a photolithography technique and an etching technique. At this time, the concave portion 40 is formed such that the bottom of the concave portion 40 reaches the surface of the semiconductor substrate 1. Then, as shown in FIG. 25, a gate dielectric film 12 is formed on the exposed surface of the semiconductor substrate 1 by using, for example, a thermal oxidization method. Here, the gate dielectric film 12 is also formed on the surface of the semiconductor substrate 1 exposed at the bottom of the concave portion 40.

The film thickness of the gate dielectric film 12 formed at the bottom of the concave portion 40 is equal to the film thickness of the gate dielectric film 12 formed on the other surface of the semiconductor substrate 1.

Figure 26:
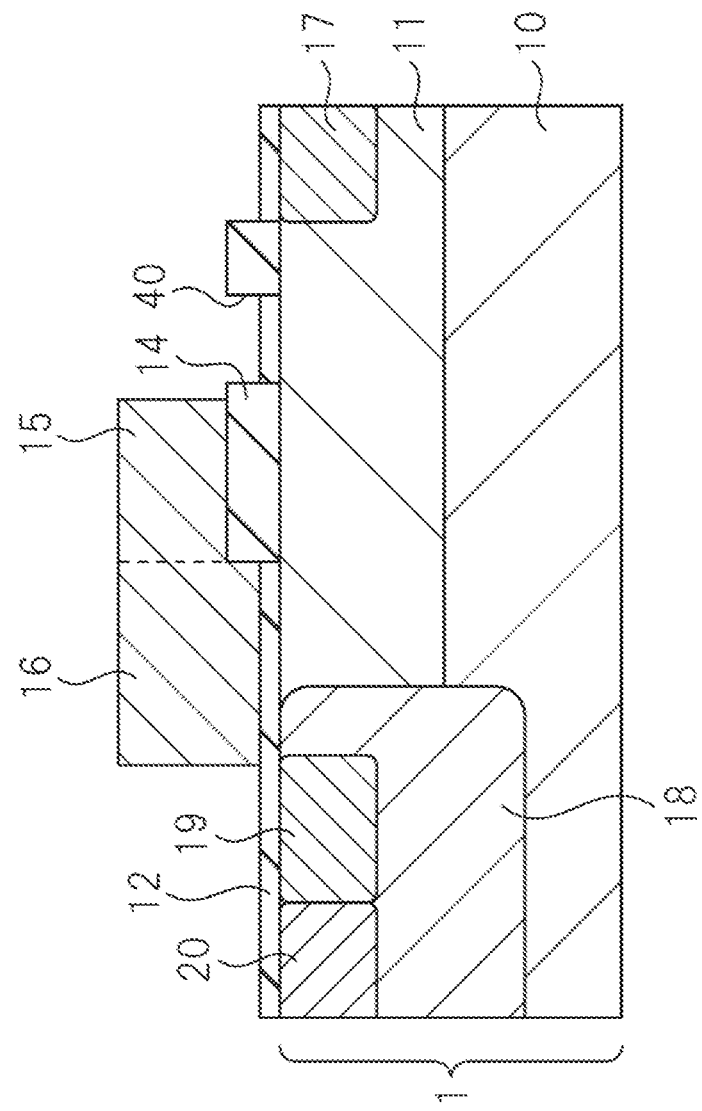
FIG. 26 is a cross-sectional view showing the manufacturing process of semiconductor device following FIG. 25.

Next, as shown in FIG. 26, a polysilicon film is formed on the gate dielectric film 12 and the step insulating film 14 by using, for example, the CVD method. Then, the polysilicon film is patterned by using photolithography and etching techniques. Thus, a gate electrode 16 and a field plate portion 15 formed of the polysilicon film are integrally formed. Thereafter, boron, which is a p-type impurity, is implanted into the semiconductor substrate 1 by using a photolithography technique and an oblique ion implantation method to form the p-type body regions 18. Next, by using a photolithography technique and an ion implantation method, phosphorus which is an n-type impurity is implanted into the semiconductor substrate 1 to form the drain region 17 and the source region 19, and boron, which is a p-type impurity, is implanted into the semiconductor substrate 1 to form the body contact region 20. Then, as shown in FIG. 23, a high dielectric constant film 30 is formed so as to cover the exposed gate dielectric film 12, the gate electrode 16, the field plate portion 15, and the exposed step insulating film 14. Thereafter, through the interlayer insulating film forming step to form interlayer insulating films and wiring forming step to form wirings, it is possible to manufacture a semiconductor device including LDMOSFET 100E.

Advantage of Fourth Modified Example

For example, in the above third modified example, since the film thickness "t2" of the "thin film portion" differs from the film thickness of the gate dielectric film 12, the etching amount of the concave portion 40 needs to be adjusted in the step of forming the concave portion 40 (refer to FIG. 20). On the other hand, in the present fourth modified example, since the film thickness "t2" of the "thin film portion" is made equal to the film thickness of the gate dielectric film 12, for example, as shown in FIG. 24, in the step of forming the concave portion 40, the concave portion 40 may be formed so as to expose the semiconductor substrate 1 at the bottom of the concave portion 40 without finely adjusting the etching amount of the concave portion 40. This is because "over etching" is also allowed, the advantage that the etching step for forming the concave portion is facilitated is obtained. Then, in the present fourth modified example, by applying the thermal oxidation method to the exposed entire surface of the semiconductor substrate 1 including the surface of the semiconductor substrate 1 exposed from the bottom of the concave portion 40, since the gate dielectric film 12 is also formed at the bottom of the concave portion 40, the film thickness "t2" of the "thin film portion" can be automatically made equal to the film thickness of the gate dielectric film 12 of the other regions.

The invention made by the present inventor has been described above in detail based on the embodiment, but the present invention is not limited to the embodiment described above, and it is needless to say that various modifications can be made without departing from the gist thereof.

The embodiment includes the following embodiments.

Appendix 1

Method of Manufacturing Semiconductor Device According to Embodiment

A method of manufacturing a semiconductor device, the method includes:
(a) forming a gate dielectric film on a semiconductor substrate;
(b) forming a high dielectric constant film having a higher dielectric constant than silicon on the gate dielectric film;
(c) forming a step insulating film in contact with the high dielectric constant film; and
(d) integrally forming a gate electrode in contact with the high dielectric constant film and a field plate portion in contact with the step insulating film.

Appendix 2

Method of Manufacturing Semiconductor Device According to First Modified Example A method of manufacturing a semiconductor device, the method includes:
(a) forming a gate dielectric film on a semiconductor substrate;
(b) forming a high dielectric constant film having a higher dielectric constant than silicon on the gate dielectric film;
(c) forming a step insulating film in contact with the high dielectric constant film;
(d) removing the high dielectric constant film exposed from the step insulating film; and
(e) integrally forming a gate electrode in contact with the gate dielectric film and a field plate portion in contact with the step insulating film.

Appendix 3

Method of Manufacturing Semiconductor Device According to Second Modified Example A method of manufacturing a semiconductor device, the method includes:
(a) forming a step insulating film on a semiconductor substrate;
(b) forming a gate dielectric film on the semiconductor substrate except for the step insulating film;
(c) integrally forming a gate electrode in contact with the gate dielectric film and a field plate portion in contact with the step insulating film; and
(d) forming a high dielectric constant film having a higher dielectric constant film than silicon so as to be in contact with the gate electrode, the field plate portion and the step insulating film,

Appendix 4

Method of Manufacturing Semiconductor Device According to Third Modified Example A method of manufacturing a semiconductor device, the method includes:
(a) forming a step insulating film on a semiconductor substrate;
(b) forming a concave portion in the step insulating film;
(c) forming a gate dielectric film on the semiconductor substrate except for the step insulating film;
(d) integrally forming a gate electrode in contact with the gate dielectric film and a field plate portion in contact with the step insulating film, the field plate portion being not in contact with the concave portion; and
(e) forming a high dielectric constant film having a higher dielectric constant film than silicon so as to be in contact with the gate electrode, the field plate portion and the step insulating film.

Appendix 5

Method of Manufacturing Semiconductor Device According to Fourth Modified Example A method of manufacturing a semiconductor device, the method includes:
(a) forming a step insulating film on a semiconductor substrate;
(b) forming a concave portion reaching the semiconductor substrate in the step insulating film;
(c) forming a gate dielectric film on the semiconductor substrate including a bottom of the concave portion;
(d) integrally forming a gate electrode in contact with the gate dielectric film and a field plate portion in contact with the step insulating film, the field plate portion being not in contact with the concave portion; and
(e) forming a high dielectric constant film having a higher dielectric constant film than silicon so as to be in contact with the gate electrode, the field plate portion, the step insulating film and an inner side surface of the concave portion.

What is claimed is:
1. A semiconductor device comprising:
a semiconductor substrate;
a gate dielectric film formed on the semiconductor substrate;
a gate electrode formed over the gate dielectric film;
a field plate portion integrally formed with the gate electrode;
a step dielectric film in contact with the field plate portion; and
a high dielectric constant film having a higher dielectric constant than silicon, the high dielectric constant film being in contact with the step dielectric film, wherein the high dielectric constant film includes:
a first portion sandwiched between the gate dielectric film and the gate electrode; and
a second portion sandwiched between the step dielectric film and the gate dielectric film.

2. The semiconductor device according to claim 1,
wherein the high dielectric constant film has a function of forming a potential barrier on a surface of the semiconductor substrate by shifting a Fermi level on the surface of the semiconductor substrate located under the step dielectric film.

3. The semiconductor device according to claim 1,
wherein a material of the high dielectric constant film includes any of HfSiO, HfSiON, HfAlON, $Y_2O_3$ or $Al_2O_3$.

4. The semiconductor device according to claim 1,
wherein the high dielectric constant film is formed of a portion sandwiched between the step dielectric film and the gate dielectric film.

5. The semiconductor device according to claim 1,
wherein the high dielectric constant film is a film covering the gate electrode, the field plate portion and the step dielectric film.

6. The semiconductor device according to claim 5,
wherein the step dielectric film includes:
a contact portion in contact with the field plate portion; and
a non-contact portion protruded from the field plate portion, and
wherein the non-contact portion includes:
a thin film portion on which a recess portion is formed; and
a thick film portion having a thicker film thickness than the thin film portion.

7. The semiconductor device according to claim 6,
wherein a film thickness of the thin film portion is equal to a film thickness of the gate dielectric film.

8. A semiconductor device comprising:
a semiconductor substrate;
a gate dielectric film formed on the semiconductor substrate;
a gate electrode formed over the gate dielectric film;
a field plate portion integrally formed with the gate electrode;
a step dielectric film in contact with the field plate portion; and
a potential control film in contact with the step dielectric film, the potential control film forming a potential barrier on a surface of the semiconductor substrate located under the step dielectric film.

9. The semiconductor device according to claim 8,
wherein the potential control film is a film forming the potential barrier on the surface of the semiconductor substrate by shifting a Fermi level on the surface of the semiconductor substrate located under the step dielectric film.

10. A semiconductor device comprising:
a semiconductor substrate;
a gate dielectric film formed on the semiconductor substrate;
a gate electrode formed over the gate dielectric film;
a field plate portion integrally formed with the gate electrode;
a step dielectric film in contact with the field plate portion; and
a high dielectric constant film having a higher dielectric constant than silicon, the high dielectric constant film being in contact with the step dielectric film,
wherein the high dielectric constant film has a function of forming a potential barrier on a surface of the semiconductor substrate by shifting a Fermi level on the surface of the semiconductor substrate located under the step dielectric film.

* * * * *